United States Patent
Chaudhary et al.

(10) Patent No.: US 6,415,425 B1
(45) Date of Patent: Jul. 2, 2002

(54) METHOD FOR ANALYTICAL PLACEMENT OF CELLS USING DENSITY SURFACE REPRESENTATIONS

(75) Inventors: Kamal Chaudhary; Sudip K. Nag, both of San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/262,727

(22) Filed: Mar. 4, 1999

(51) Int. Cl.[7] .............................................. G06F 17/50
(52) U.S. Cl. .................................. 716/9; 716/8; 716/10
(58) Field of Search ................................ 716/10, 2, 8, 9

(56) References Cited

U.S. PATENT DOCUMENTS

| | | | | |
|---|---|---|---|---|
| 5,943,243 A | * | 8/1999 | Sherlekar et al. ............... | 716/9 |
| 6,067,409 A | * | 5/2000 | Scepanovic et al. ........... | 716/8 |
| 6,068,662 A | * | 5/2000 | Scepanovic et al. ........... | 716/2 |
| 6,155,725 A | * | 12/2000 | Scepanovic et al. ........... | 716/9 |
| 6,182,271 B1 | * | 1/2001 | Yahagi ........................ | 716/10 |
| 6,192,508 B1 | * | 2/2001 | Malik et al. ................... | 716/9 |

OTHER PUBLICATIONS

Wakabayashi et al, "An Optimal Pin Assignment Algorithm with Improvement of Cell Placement in Standard Cell Layout," IEEE, Nov. 1996, pp. 381–384.*

Wakabayashi et al, "Timing–Driven Pin Assigment with Improvement of Cell Placement in Standard Cell Layout," IEEE, Jun. 1997, pp. 1552–1555.*

Hans Eisenmann, Frank M. Johannes, "Generic Global Placement and Floorplanning", Institute of Electronic Design Automation, Technical University Munich, 80290 Munich, Germany, Copyright 1998, pp. 269–274.

"The Programmable Logic Data Book 1998", published by Xilinx, Inc., located at 2100 Logic Drive, San Jose, California 95124.

* cited by examiner

*Primary Examiner*—Vuthe Siek
(74) *Attorney, Agent, or Firm*—LeRoy D. Maunu

(57) ABSTRACT

A method for analytical placement of cells using density surface representations. The placement of the cells is characterized as density surface fun which is two-dimensional and continuous. The cells are iteratively moved from areas having higher densities of placed cells to areas having lower densities of placed cells using the density surface function.

14 Claims, 8 Drawing Sheets

$$\Phi = \frac{2}{M} \sum_{k=1}^{N} \sum_{i=0}^{M-1} \sum_{j=0}^{M-1} C_i C_j \mu_{ij}^{cur} \cos(\psi(x_k,i)) \times \cos(\psi(y_k,j))$$

$$\psi(x,i) = \frac{(2x+1)\pi i}{2M}, C_0 = \frac{1}{\sqrt{2}}, C_{i\text{-}0} = 1$$

$$\frac{\partial^2 \Phi}{\partial x_k^2} = \frac{2}{M} \sum_{k=1}^{N} \sum_{i=0}^{M-1} \left( \sum_{j=0}^{M-1} -\mu_{ij} C_i C_j \cos(\Psi(x_k,i)) \times \cos(\Psi(y_k,j)) \right) \times \left(\frac{i\pi}{2M}\right)^2$$

$$\frac{\partial^2 \Phi}{\partial y_k^2} = \frac{2}{M} \sum_{k=1}^{N} \sum_{j=0}^{M-1} \left( \sum_{i=0}^{M-1} -\mu_{ij} C_i C_j \cos(\Psi(x_k,i)) \times \cos(\Psi(y_k,j)) \right) \times \left(\frac{j\pi}{2M}\right)^2$$

$$\frac{\partial^2 \Phi}{\partial x_k \partial y_k} = \frac{2}{M} \sum_{k=1}^{N} \sum_{i=0}^{M-1} \left( \sum_{j=0}^{M-1} \mu_{ij} C_i C_j \sin(\Psi(x_k,i)) \times \sin(\Psi(y_k,j)) \times ij \right) \times \left(\frac{\pi}{2M}\right)^2$$

FIG. 6B

METHOD FOR ANALYTICAL PLACEMENT OF CELLS USING DENSITY SURFACE REPRESENTATIONS

FIELD OF THE INVENTION

The present invention generally relates to placing cells on a programmable logic device, and more particularly, placing cells using a density surface representation.

BACKGROUND

Field programmable gate arrays (FPGAs), first introduced by XILINX in 1985, are becoming increasingly popular devices for use in electronics systems. For example, communications systems employ FPGAs in large measure for their re-programmability. In general, the use of FPGAs continues to grow at a rapid rate because they permit relatively short design cycles, reduce costs through logic consolidation, and offer flexibility in their re-programmability. The capabilities of and specifications for XILINX FPGAs are set forth in "The Programmable Logic Data Book," published in 1998 by XILINX, Inc., the contents of which is incorporated herein by reference.

The challenges facing today's floorplanning tools are that timing constraints are becoming ever more stringent, and the number of cells to be placed is increasing rapidly. Thus, finding a feasible placement using present tools can take a very long time. Two types of processes are generally known to be used. A first type of process attempts to maintain a feasible placement throughout the placement process, and one or more selected parameters are optimized, for example, wire length and timing. While feasible placements are produced by these processes, the algorithms are generally understood to take a very long time.

A second type of placement process is termed "analytical." Analytical processes treat cells as points. The first phase distributes cells over the placement area while attempting to reduce wire-length. The first phase of the analytical processes oftentimes produce a placement that is not feasible, and a subsequent phase is required to eliminate the overlaps while keeping the wire-length low. Thus, the more overlaps that remain after the first phase of the analytical process the more time the subsequent phase will require to produce a feasible placement. Thus, a process that executes quickly and that reduces the overlaps in a placement would therefore be desirable.

SUMMARY OF THE INVENTION

The method of the present invention generally uses a density surface representation of a placement in spreading cells. By considering the entire surface density, the cells can be moved in a manner that quickly minimizes the number of overlaps while keeping the wire-length low.

In one embodiment, a method is provided for analytical placement of cells using density surface representations. The placement of cells is characterized as a density surface function using a two-dimensional continuous function. The cells are iteratively moved from areas having higher densities of placed cells to areas having lower densities of placed cells using the density surface function.

The above summary of the present invention is not intended to describe each disclosed embodiment of the present invention. The figures and detailed description that follow provide additional example embodiments and aspects of the present invention.

BRIEF DESCRIPTION OF THE DRAWINGS

Various aspects and advantages of the invention will become apparent upon review of the following detailed description and upon reference to the drawings in which:

FIG. 6B defines the gradients or derivatives for the density surface represented using a discrete cosine transform.

Figures 1A, 1B:
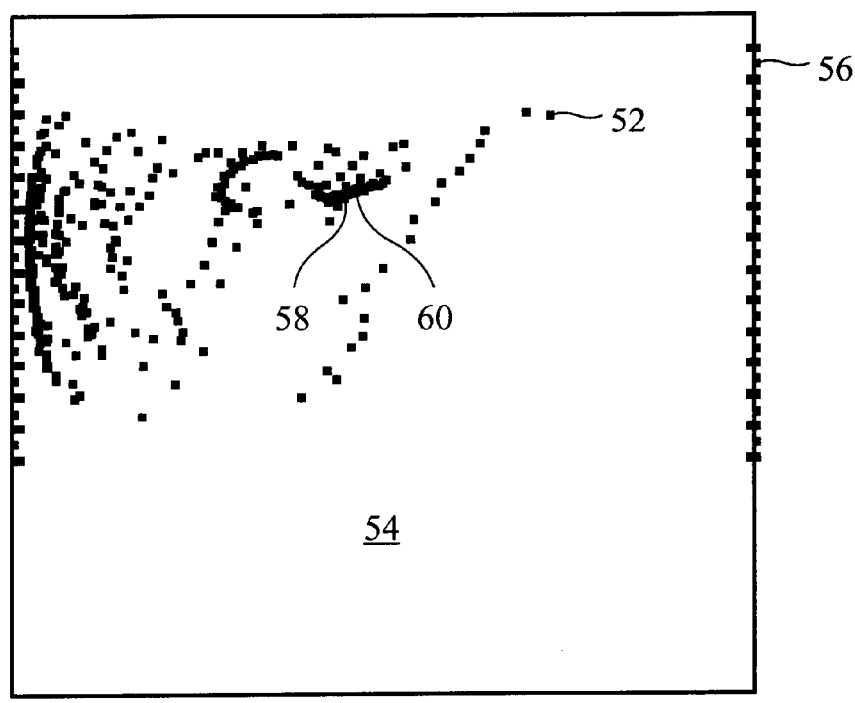
FIG. 1A illustrates an example initial placement of cells on an example device.
FIG. 1B is a density matrix D constructed in accordance with the example placement illustrated in FIG. 1A.

While the invention is susceptible to various modifications and alternative forms, specific embodiments thereof have been shown by way of example in the drawings and will herein be described in detail. It should be understood, however, that the detailed description is not intended to limit the invention to the particular forms disclosed. On the contrary, the intention is to cover all modifications, equivalents, and alternatives falling within the spirit and scope of the invention as defined by the appended claims.

DETAILED DESCRIPTION

The present invention is believed to be applicable to a variety of tools for placing circuit elements of a design for application specific integrated circuit (ASIC) implementations as well as for implementations using programmable logic devices (PLDs). The present invention has been found to be particularly applicable and beneficial in placing circuit elements or "cells" in programmable logic devices such as field programmable gate arrays (FPGAs). While the present invention is not so limited, an appreciation of the present invention is presented by way of specific examples, in this instance, in the context of placement of cells on an FPGA.

The method of the example embodiment takes as input cells that are output from the logic optimization and technology mapping phases of a conventional design process, where the cells are ready for placement. The process begins with an initial placement of the cells. The initial placement is constructed using an input set of cells, some of which are movable, and some of which are fixed. The fixed cells are assigned to input/outputs of the device, for example. Constructing the initial placement also uses the connectivity between the cells specified in the input design.

FIG. 1A illustrates an example initial placement of cells on an example device. Each darkened square 52 represents a cell, and the position of the cell represents the placement location on the device. Block 54 represents an example device, such as an FPGA, and cell 56 is a cell placed on an input/output block of the device. All the blocks along the outer perimeter of block 54 are cells placed on input/output blocks, and their respective placements are fixed.

The remainder of the cells are placed at various locations on device 54. The example embodiment begins with an initial placement that is not feasible. That is, some of the cells are placed in the same locations or overlap. Therefore, all the cells may not be visible in the representation of FIG. 1A.

The density of the initial placement can be generally seen in FIG. 1A. For example, cell 52 is placed in an area where there are no immediate, adjacent cells. In contrast, cells 58 and 60 are placed in an area in which there are many adjacent cells, and while not visible in FIG. 1A, some of the cells may be placed one on the other. Thus, cells 58 and 60 are placed in an area with a higher density, and cell 52 is placed in an area with a lower density. It is clear that cells that overlap or are placed on one another must be spread for a feasible placement. Thus, by iteratively moving cells from high density areas to low density areas, the evolving placement is more likely to progress towards a feasible placement. It will be appreciated that it is desirable to keep the wire-length low while spreading the cells.

FIG. 1B is a density matrix D constructed in accordance with the example placement illustrated in FIG. 1A. In the example embodiment, density matrix D has 8 rows and 8 columns, wherein the values in the matrix are the total numbers of cells placed within corresponding areas of the device. Thus, device 54 is divided into 8 rows and 8 columns, and each entry in the matrix is the total number of cells placed at the corresponding area in device 54. For example, there are no cells placed in row 1 column 1 of device 54, while there are 57 cells placed at row 3 column 1. The relative placement densities of cells in the areas of device 54 can be seen quantitatively in matrix D.

Figure 2:
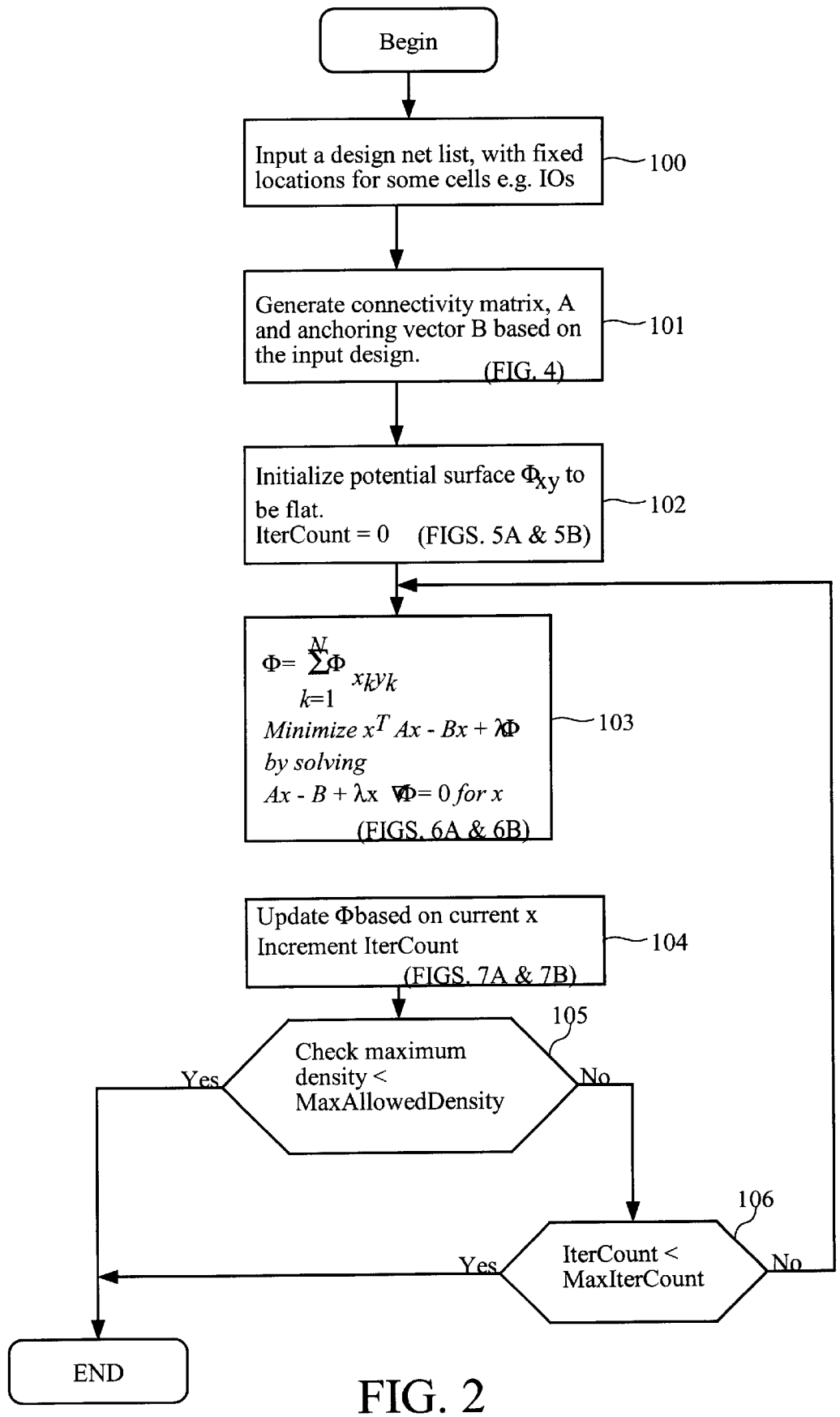
FIG. 2 is a flowchart of a method for placing cells on a programmable logic device in accordance with an example embodiment of the invention.

FIG. 2 is a flowchart of a method for placing cells on a programmable logic device in accordance with an example embodiment of the invention. The method generally comprises beginning with an initial placement of cells, wherein some of the cells are fixed at selected locations. The placement is represented as density surface data, and the cells are moved from locations having higher densities of placed cells to locations having lower densities.

At step 100 a design netlist is input to the example process. Some of the cells in the input netlist have fixed locations. For example, some of the cells are placed on input/output blocks of an FPGA.

Connectivity matrix A and anchoring vector B are generated from the input netlist at step 101. The connectivity matrix represents connections among the movable cells in the netlist, and the anchoring vector represents the connections between movable cells and fixed cells in the netlist. Both the connectivity matrix and the anchoring matrix have weighted values depending on the fanout and timing criticality of the respective cells. The matrices can then be used to produce a placement while minimizing the wire-length.

Along with the connectivity matrices, the example method uses a function that is expressed in terms of the density surface of a placement. Initially, the value of the density surface function and iteration count are initialized to zero at step 102. The density surface function represents, for example, the two-dimensional density matrix D, as a continuous two-dimensional function $\Phi_{xy}$. Thus, in addition to the costs associated with connectivity between cells, the placement process considers the costs of present placements of cells in terms of the placement density. Areas of the device having high densities of placed cells have higher associated costs than areas of the device having lower densities.

As shown in step 103, $\Phi$ is the summation of the density surface costs of all the cells, that is:

$$\Phi = \sum_{k=1}^{N} \Phi x_k y_k$$

Vector x is comprised of: $x=[x_1, x_2, x_3, \ldots, X_N, y_1, y_2, y_3, \ldots, y_N]^T$, where $x_i$ and $y_i$ are the Cartesian coordinates of cell i. Vector x, connectivity matrix A, anchoring vector B, and density surface function $\Phi$ are then used to generate a new placement for the cells. That is, the function $x^T Ax - Bx + \lambda \Phi$ is minimized by solving for x:

$Ax - B + \lambda \times \text{first derivative}(\Phi) = 0$

The $\lambda$ term is a scaling factor that is selected in accordance with the desired importance of the density in the minimization function relative to, for example, wire-length and timing minimization.

It will be appreciated that because the $\Phi$ term must be differentiated in the minimization, the chosen $\Phi$ function must define a continuous surface.

Step 104 then updates $\Phi$ based on the current x, and increments the iteration count variable. If the maximum density at any point (x,y) is less than a desired maximum density, the process is complete. Otherwise, decision step 105 directs control to decision step 106. It will be appreciated that the maximum density can be determined, for example, from a representation such as matrix D of FIG. 1B, where the entry with the maximum density has a value of 57. If this maximum exceeds a desired value, then the process should continue. In other embodiments, an average maximum density could be used instead of the maximum density. For example, the m greatest density areas could be averaged and compared to a desired value.

At decision step 106, the iteration count is compared to a desired maximum number of iterations. Control is returned to step 103 if the maximum number of iterations has not been reached. Otherwise, the process is complete.

Figure 3:
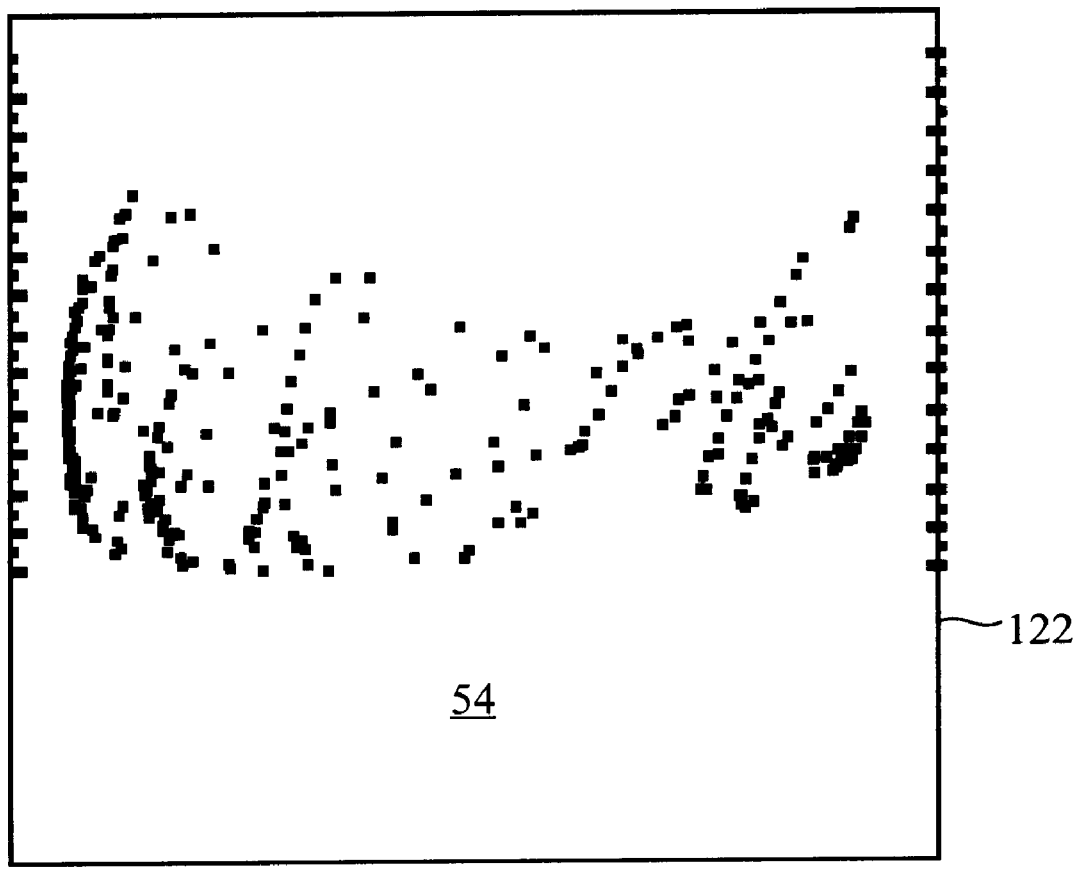
FIG. 3 illustrates an example placement of the cells of FIG. 1A after having moved cells from locations having higher densities to locations having lower densities using the minimization of density surface technique.

FIG. 3 illustrates an example placement of the cells of FIG. 1A after having moved cells from locations having higher densities to locations having lower densities using the minimization of density surface technique. It can be seen that the cells have moved closer to the right side 22 of device 54. In addition, the clusters in FIG. 1A in which cells 58 and 60 were initially placed, have been dispersed.

Figure 4:
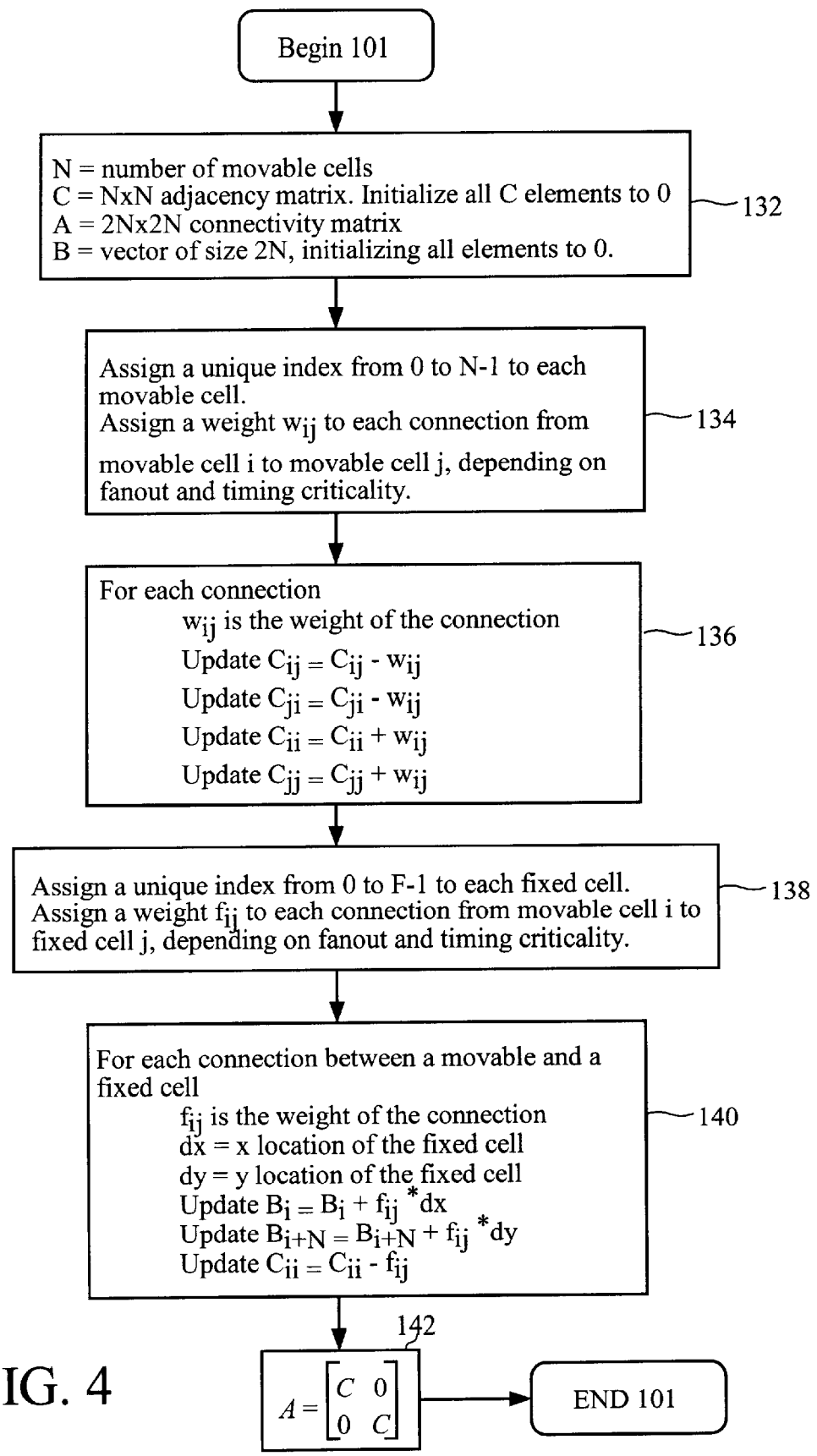
FIG. 4 is a flowchart of a method for constructing a connectivity matrix and an anchoring vector in accordance with an example embodiment of the invention.

FIG. 4 is a flowchart of a method for constructing a connectivity matrix and an anchoring matrix in accordance with an example embodiment of the invention (step 101 of FIG. 2). The method generally comprises assigning respective weights to the connections between the movable cells and therefrom constructing a connectivity matrix. In addition, respective weights are assigned to the connections between the movable cells and the fixed cells and therefrom an anchoring matrix is constructed.

Step 132 sets forth the definitions of N, C, A, and B. At step 134, unique indices are assigned to the movable cells, and respective weights are assigned to the connections between the movable cells. The movable cells' locations are defined as: $x=[x_0, x_1, x_2, \ldots, X_{N-1}, y_0, y_1, y_2, \ldots, y_{N-1}]^T$. The cells are numbered 0–(N-1), and the weight, $w_{ij}$, being the weight associated the connection between cells i and j. The magnitude of the weight depends on the criticality of the fanout and timing, for example.

Step 136 shows the construction of adjacency matrix C. Elements in matrix C are referenced as $C_{ij}$, where i is the row index and j is the column index. For a connection between cells i and j, with weight $w_{ij}$, the weight $-w_{ij}$ is added to $c_{ij}$ and to $C_{ji}$, and $w_{ij}$ is added to $C_{ii}$ and $C_{jj}$. This process is repeated for all connections.

Unique indices are assigned to the fixed cells, and respective weights ($f_{ij}$) are assigned to the connections between the movable cell i and the fixed cell j at step 138. Step 140 updates anchoring vector B and connectivity matrix C using the weights $f_{ij}$. Since vector B has entries for both x and y coordinates, its length is 2N. Both the x and y components of anchoring vector B are updated using the locations of the cells in combination with the assigned weights. Note also that each entry $C_{ii}$ is updated with $C_{ii}+f_{ij}$. This process is repeated for each connection between the fixed and movable cells.

Step 142 shows the composition of connectivity matrix A. As shown by step 132, A is 2N×2N (2N rows and 2N columns). The upper left (for the x domain) and lower right (for the y domain) entries of A are provided by matrix C, and all the remaining entries are 0. After constructing connectivity matrix A, processing continues at step 102 of FIG. 2.

Figure 5A:
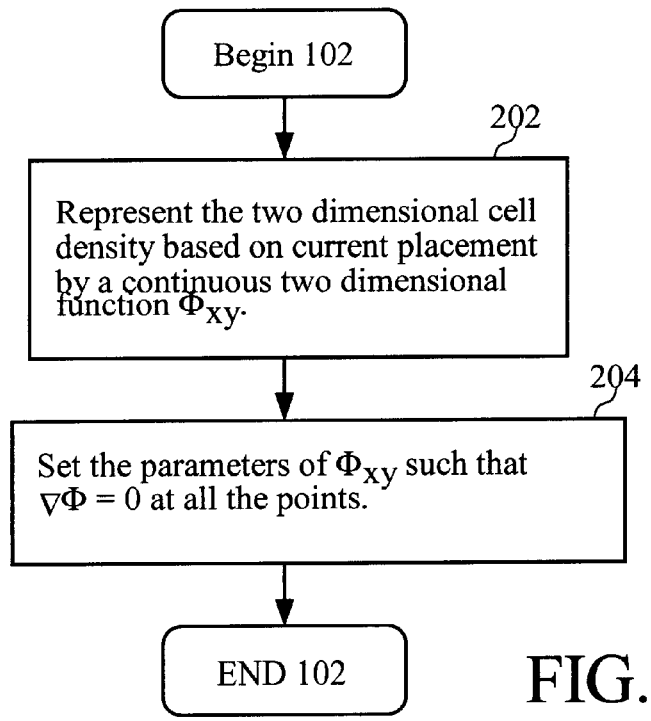
FIGS. 5A and 5B illustrate generic and specific example embodiments for formulating a density surface based on placement.
Figure 5B:
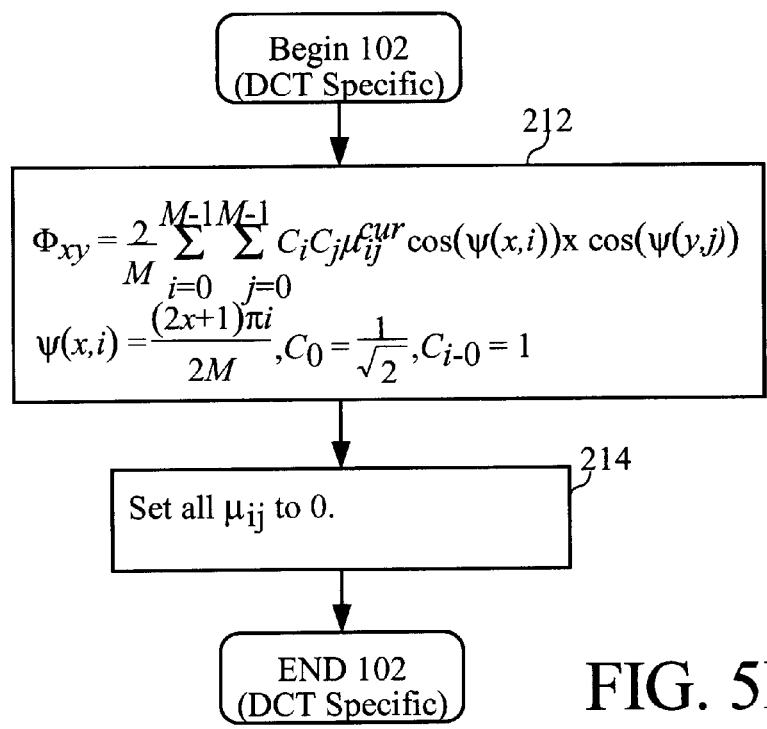

FIGS. 5A and 5B illustrate generic and specific example embodiments for representing placement of the cells as density surface data (step 102 of FIG. 2). In the embodiment of FIG. 5A, the cell placement density is represented as a continuous two-dimensional function $\Phi_{xy}$. At step 204, the parameters of $\Phi_{xy}$ are initialized such that the first-order derivative of $\Phi=0$ at all points. This may be thought of as a flat density surface. Those skilled in the art will appreciated that $\Phi_{xy}$ could generally be defined as a polynomial function of the form:

$$\Phi = \sum_{i=1}^{R-1} \sum_{j=1}^{R-1} a_{ij} x^i y^j$$

Control is then returned to step 102 of FIG. 2.

FIG. 5B is a flowchart of a specific continuous two-dimensional function $\Phi_{xy}$, wherein the discrete cosine transform (DCT) is used as the function. Step 212 sets forth the DCT expressed in terms of DCT coefficients, $\mu_{ij}$ and M, where M is a constant representing the order of the selected DCT surface. It will be appreciated that greater values for M provide better surface representations. However, the number of computations increases as M increases. In an example embodiment, M is set to 8. DCT coefficients are calculated based on the density matrix and are described in FIG. 7B.

At step 214, the $\mu_{ij}$ terms are all initialized to 0 to represent an initially flat surface, and control is returned to step 102 of FIG. 2.

Figure 6A:
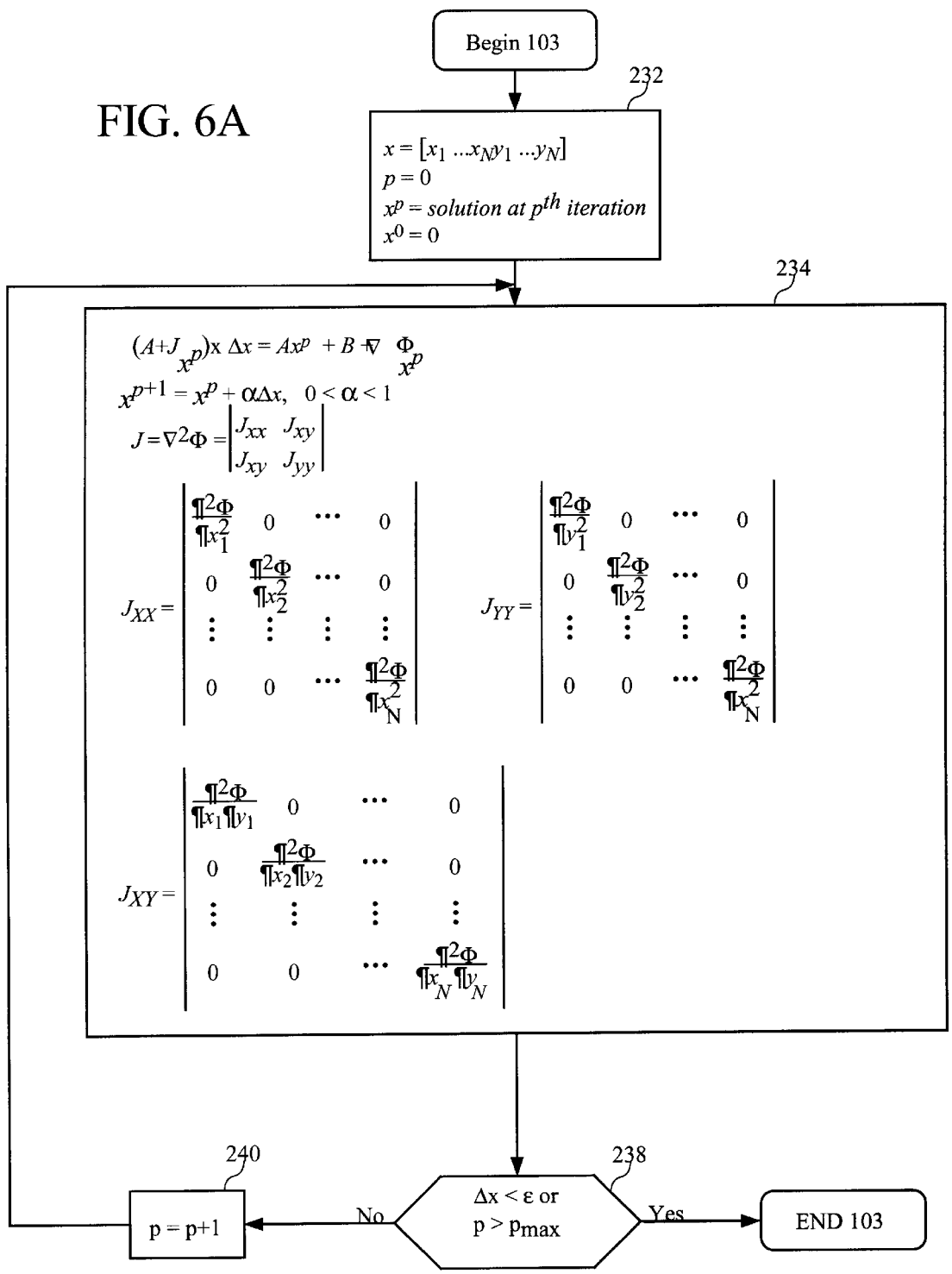
FIG. 6A is a flowchart of a method for moving the cells from locations having higher densities to locations having lower densities by using the density surface gradient.

FIG. 6A is a flowchart of a method for moving the cells from locations having higher densities to locations having lower densities by using the density surface gradient. Step 232 restates the composition of vector x, initializes p to 0, and defines $x^p$ as the composition of vector x at the $p^{th}$ iteration and $x^0$ as null. Step 234 illustrates application of the Newton Raphson technique on density surface for solving for $x^{p+1}$. Where the DCT is used to represent the density surface, the required second order surface derivatives are evaluated, as shown in block 236 of FIG. 6B.

Decision step 238 tests whether the change in x is less than a desired level $\epsilon$, or the number of iterations is greater than a desired number, $p_{max}$. If the change in x is greater than or equal to the desired value and the number of iterations is less than or equal to the maximum number of iterations, control is directed to step 240 where the loop counter is incremented. Otherwise control is returned to step 103 of FIG. 2. Note that the change in x can be computed using the first equation in block 234.

Figures 7A, 7B:
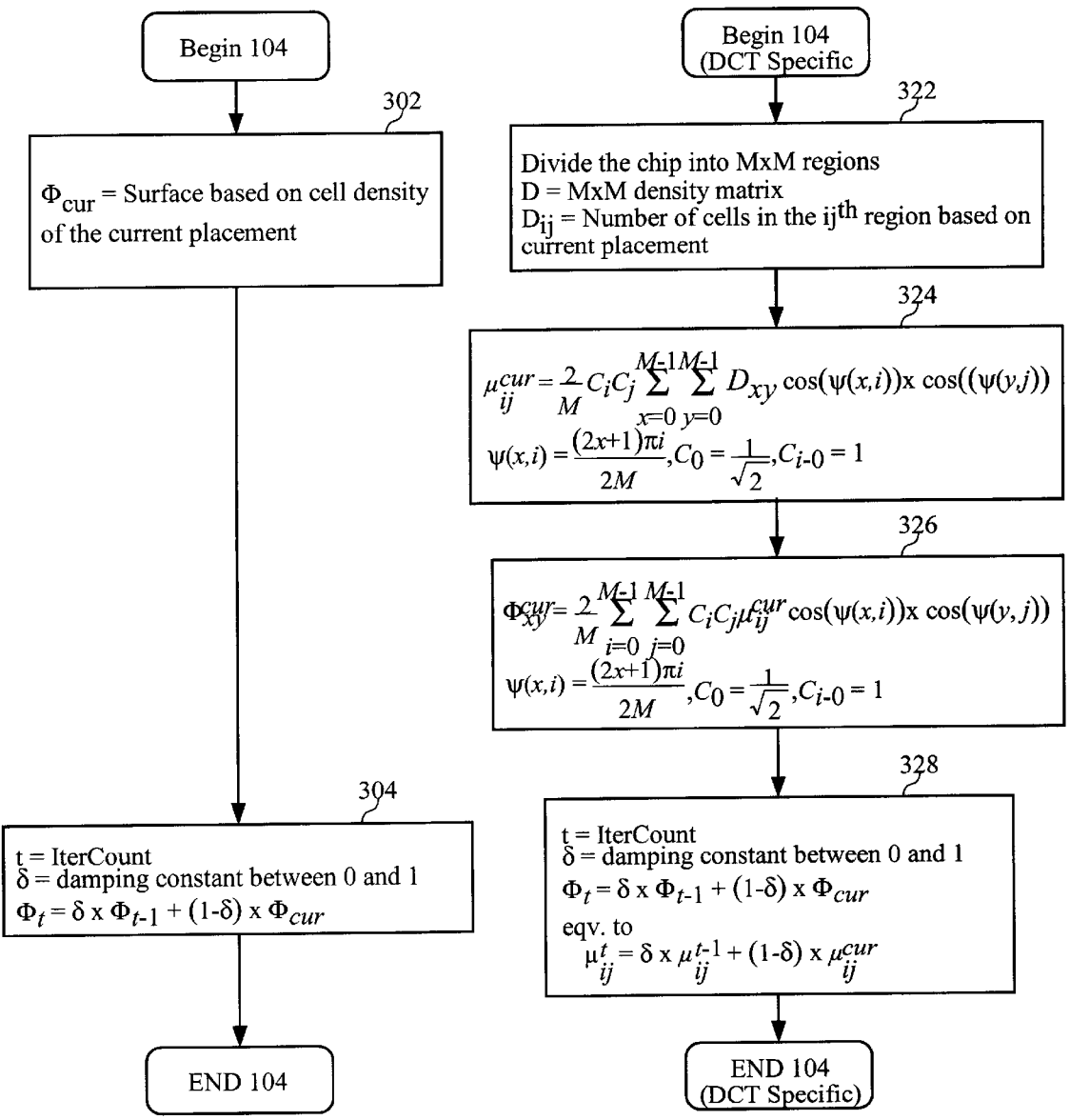
FIGS. 7A and 7B are flowcharts of generic and specific methods for updating the current density surface based on the new locations of the cells.

FIGS. 7A and 7B are flowcharts of generic and specific methods for updating the current density surface based on the new locations of the cells (step 104 of FIG. 2). Step 302 establishes a temporary current density surface value $\Phi_{cur}$ based on the new placement of the cells.

At step 304, a density surface value $\Phi_t$ (the density surface value at iteration t, which is returned to step 104 of FIG. 2) is established as a function of the temporary current density surface, the density surface of the previous iteration, the iteration count, and a damping constant. The damping constant · is used to avoid unnecessary oscillation of cells. That is, the purpose is to avoid large movement of cells causing new dense regions to be formed in successive iterations. Control is then returned to step 104 of FIG. 2.

FIG. 7B is a flowchart of a method for computing a density surface value using DCT techniques, for example. At step 322, the target device is divided into $M^2$ regions of M rows and M columns. A density matrix D is established based on the numbers of cells respectively placed in the $M^2$ regions (see, for example, density matrix D of FIG. 1B). Steps 324 and 326 illustrate application of DCT techniques for computing the density surface value. Step 328 computes $\Phi_t$ in a manner similar to step 304 of FIG. 7A. Control is then returned to step 104 of FIG. 2.

Accordingly, the present invention provides, among other aspects, a method for placing cells using a density surface representation. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for placing cells on an integrated circuit, comprising:
    characterizing a placement of cells as a density surface function that is continuous and differentiable; and
    moving the cells from areas having higher densities of placed cells to areas having lower densities of placed cells using the density surface function.

2. The method of claim 1, further comprising minimizing wire lengths connecting the cells while moving the cells.

3. The method of claim 1, wherein the density surface function is a discrete cosine transform.

4. The method of claim 1, wherein the density surface function is represented as a polynomial function of the form:

$$\Phi = \sum_{i=1}^{R-1} \sum_{j=1}^{R-1} a_{ij} x^i y^j.$$

5. The method of claim 1, further comprising:
    generating a connectivity matrix, A, and an anchoring vector, B;
    wherein the density surface function is $$\Phi = \sum_{k=1}^{N} \Phi x_k y_k,$$

where N is the number of movable cells; and
    minimizing the function $x^T Ax - Bx + \lambda \Phi$, where: $x=[x_1, x_2, x_3, \ldots, x_N, y_1, y_2, y_3, \ldots, y_N]^T$, and $\lambda$ is a scaling factor indicative of relative importance of density to wirelength.

6. The method of claim 5, further comprising:

identifying an area of the circuit having a maximum number of cells;

repeating minimization of the function $x^T Ax - Bx + \lambda \Phi$, and computing a new density surface value, and identifying the area with a maximum number of cells until the maximum number of cells is less than a predetermined value.

7. The method of claim 5, further comprising:

identifying a plurality of areas of the circuit having greatest numbers of cells;

repeating minimization of the function $x^T Ax - Bx + \lambda \Phi$, and computing a new density surface value, and identifying areas with greatest numbers of cells until an average of the greatest numbers of cells is less than a predetermined value.

8. The method of claim 1, wherein some of the cells are movable and some of the cells have fixed placements.

9. The method of claim 8, further comprising:

generating a connectivity matrix, A, and an anchoring vector, B;

wherein the density surface function is $$\Phi = \sum_{k=1}^{N} \Phi_{x_k y_k},$$

where N is the number of movable cells; and minimizing the function $x^T Ax - Bx + \lambda \Phi$, where $x=[x_1, x_2, x_3, \ldots, x_N, y_1, y_2, y_3, \ldots, y_N]^T$, and $\lambda$ is a scaling factor indicative of relative importance of density to wire-length minimization.

10. The method of claim 9, wherein the connectivity matrix has weighted values of magnitudes dependent on timing criticality of respective pairs of connected movable cells.

11. The method of claim 10, wherein the anchoring vector has weighted values of magnitudes dependent on timing criticality of respective pairs of connected movable and fixed cells.

12. The method of claim 9, wherein the connectivity matrix has weighted values of magnitudes dependent on fanout of respective pairs of connected movable cells.

13. The method of claim 10, wherein the anchoring vector has weighted values of magnitudes dependent on fanout of respective pairs of connected movable and fixed cells.

14. The method of claim 9, further comprising repeating minimization of the function $x^T Ax - Bx + \lambda \Phi$ until a change in x from one minimization to a successive minimization is less than a predetermined value.

* * * * *